(12) United States Patent
Batson et al.

(10) Patent No.: US 6,282,144 B1
(45) Date of Patent: Aug. 28, 2001

(54) MULTI-PORTED MEMORY WITH ASYNCHRONOUS AND SYNCHRONOUS PROTOCOL

(75) Inventors: Kevin A. Batson, Williston; Garrett S. Koch, Jeffersonville; Sebastian T. Ventrone, South Burlington, all of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/524,661

(22) Filed: Mar. 13, 2000

(51) Int. Cl.[7] ....................................... G11C 8/00
(52) U.S. Cl. .................. 365/230.05; 710/105; 711/149
(58) Field of Search ........................ 365/230.05, 233; 709/106; 710/105; 711/149, 131

(56) References Cited

U.S. PATENT DOCUMENTS

| 4,652,993 | 3/1987 | Scheuneman et al. . |
| 5,469,549 | 11/1995 | Simpson et al. . |
| 5,504,675 | * 4/1996 | Cragun et al. .................. 364/401 |
| 5,515,523 | 5/1996 | Kalkunte et al. . |
| 5,524,098 | * 6/1996 | Holland et al. .............. 365/230.05 |
| 5,586,299 | 12/1996 | Wakerly . |
| 6,067,595 | * 5/2000 | Lindenstruth .................. 711/149 |
| 6,078,527 | * 6/2000 | Roth et al. ........................ 365/233 |

* cited by examiner

*Primary Examiner*—Richard Elms
*Assistant Examiner*—VanThu Nguyen
(74) *Attorney, Agent, or Firm*—Schmeiser, Olsen & Watts; Richard A. Henkler

(57) ABSTRACT

A multi-port memory is provided that includes means for receiving synchronous memory requests, means for receiving asynchronous memory requests, and means for processing the received synchronous and asynchronous memory requests simultaneously. Systems and methods that employ the multi-port memory are also provided.

25 Claims, 14 Drawing Sheets

MULTI-PORTED MEMORY WITH ASYNCHRONOUS AND SYNCHRONOUS PROTOCOL

FIELD OF THE INVENTION

The present invention relates generally to memory technology, and more particularly to a multi-ported memory with an asynchronous and synchronous protocol.

BACKGROUND OF THE INVENTION

A current trend in the electronics industry is to develop applications which employ multiple cores within an application specific integrated circuit (ASIC) design. Often such applications perform a large number of concurrent activities, with each activity being performed over a different "channel" of the ASIC design. To achieve the desired level of performance, channels often must operate asynchronously as well as concurrently.

One common element typically employed between channels is a memory device (e.g., a random access memory (RAM)). However, conventional RAMs are single port (or at most dual port) devices with a first-come-first serve protocol arbitrated by a memory controller. These type of limited port devices cannot support concurrent activities over multiple channels, particularly when asynchronous operations are involved. Accordingly, a need exists for a multi-ported memory with an asynchronous and synchronous protocol.

SUMMARY OF THE INVENTION

To address the needs of the prior art, an inventive multi-ported memory with an asynchronous and synchronous protocol is provided. Specifically, a multi-port memory is provided that includes means for receiving synchronous memory requests, means for receiving asynchronous memory requests, mean s for processing the received synchronous and asynchronous memory requests simultaneously. Systems and methods that employ the multi-port memory are also provided. The inventive multi-port memory can support concurrent activities over multiple channels, including both synchronous and asynchronous operations.

Other objects, features and advantages of the present invention will become more fully apparent from the following detailed description of the preferred embodiments, the appended claims and the accompanying drawings.

BRIEF DESCRIPTION OF THE DRAWINGS

The present invention is described with reference to the accompanying drawings. In the drawings, like reference numbers indicate identical or functionally similar elements. Additionally, the left-most digit of a reference number identifies the drawing in which the reference number first appears.

DETAILED DESCRIPTION OF THE PREFERRED EMBODIMENTS

Figure 1:
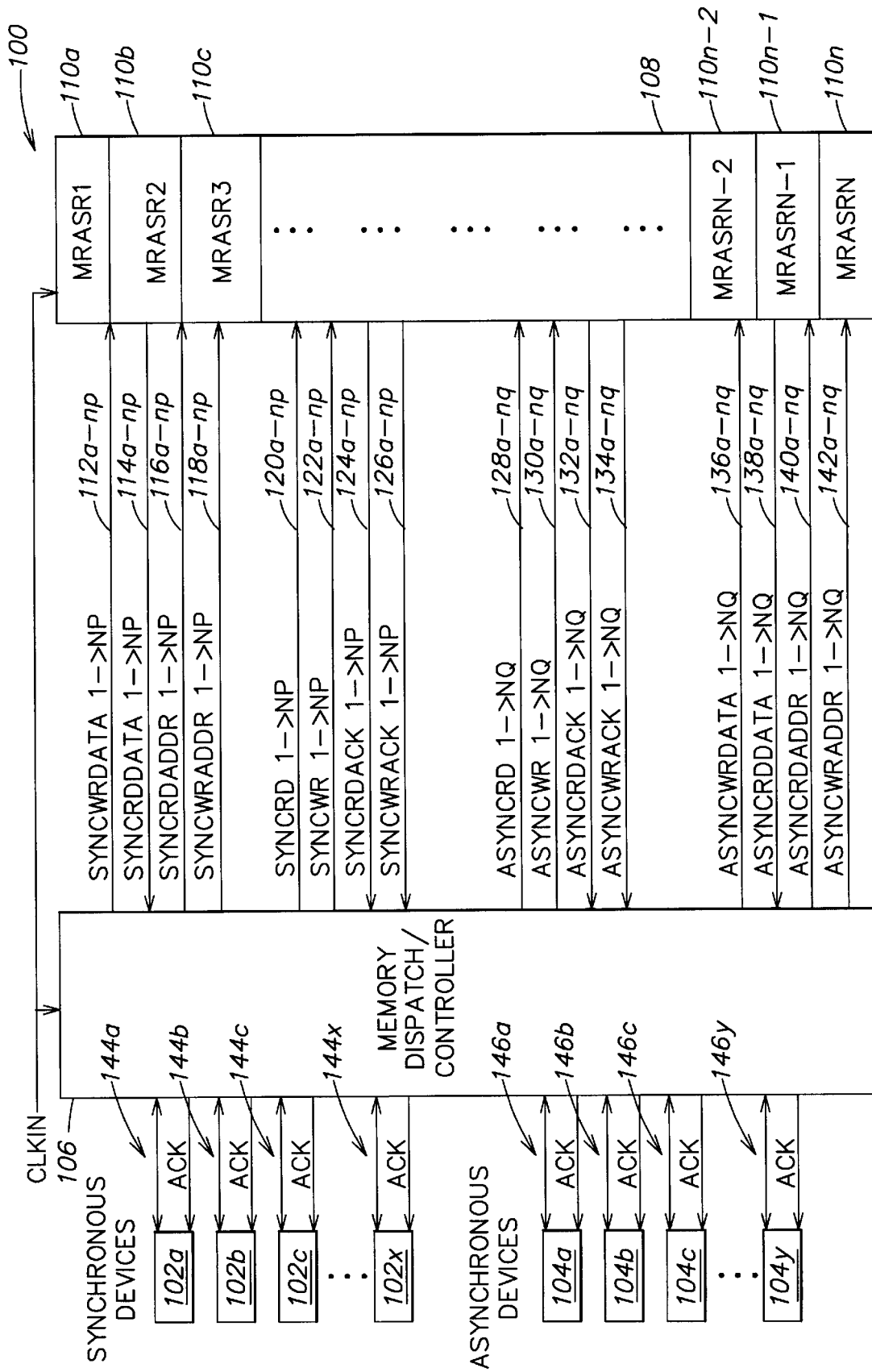
FIG. 1 is a schematic diagram of an inventive multi-ported memory system configured in accordance with the present invention.

FIG. 1 is a schematic diagram of an inventive multi-ported memory system 100 configured in accordance with the present invention. The inventive multi-ported memory system 100 comprises a plurality of synchronous devices 102a–x and a plurality of asynchronous devices 104a–y coupled to an inventive memory dispatch/controller 106, and an inventive random access memory (RAM) 108 coupled to the inventive memory dispatch/controller 106. The synchronous devices 102a–x may comprise any number of synchronous devices such as microprocessors, central processing units, microcontrollers, signal processors, control logic, etc., and the asynchronous devices 104a–y may comprise any number of asynchronous devices such as serial ports, analog-to-digital converters, etc.

The inventive memory dispatch/controller 106 preferably is based on a conventional memory controller, but includes an additional memory macro protocol (described below) that performs numerous novel memory functions. For example, the memory macro protocol preferably arbitrates synchronous and asynchronous requests from the synchronous devices 102a–x and the asynchronous devices 104a–y, monitors requests and transfers each request to an appropriate channel of the inventive multi-ported memory system 100, stalls a request if no appropriate channels exist, performs memory mapping functions, and the like. The inventive memory dispatch/controller 106's memory macro protocol may be embodied in software, hardware or a combination thereof. Preferably the memory macro protocol comprises primarily hardware as described below with reference to FIGS. 3 and 4.

The inventive RAM 108 comprises a RAM built from n multi-port memory elements referred to herein as Multi-Request Asynchronous/Synchronous RAMs (MRASRs) 110a–n. As described below, each MRASR 100a–n supports a plurality of synchronous ports and a plurality of a asynchronous ports. A sufficient number of MRASRs preferably are provided to fill the entire memory of the inventive RAM 108. Specifically, the number of MRASRs define the granularity of the inventive RAM 108, and the granularity and size of the inventive RAM 108 define the memory size of each MRASR 110a–n. For example, if the inventive RAM 108 is a 32 Kbyte RAM, and a granularity of 32 is desired, the memory size of each MRASR 110a–n is 1 Kbyte.

FIG. 1 represents a "fully wired" version of the inventive multi-ported memory system 100 wherein a sufficient number of busses are provided so that each port of each MRASR 110a–n has its own set of busses. For n MRASRs each having m ports, n times m (hereinafter "nm") bus sets or "channels" must be provided for a fully wired version of the inventive multi-ported memory system 100. Each synchronous channel may include one or more of:

1) a synchronous write data bus 112 for supplying data (SYNCWRDATA) to an MRASR 110a–n during a synchronous write to the MRASR 110a–n;

2) a synchronous read data bus 114 for receiving data (SYNCRDDATA) from an MRASR 110a–n during a synchronous read from the MRASR 110a–n;

3) a synchronous read address bus 116 for supplying to an MRASR 110*a–n* an address (SYNCRDADDR) of data stored within the MRASR 110*a–n* that is to be synchronously read from the MRASR 110*a–n*;

4) a synchronous write address bus 118 for supplying to an MRASR 110*a–n* an address (SYNCWRADDR) of a memory location within the MRASR 110*a–n* where data is to be synchronously written to the MRASR 110*a–n*;

5) a synchronous read command bus 120 for supplying a synchronous read command (SYNCRD) to an MRASR 110*a–n*;

6) a synchronous write command bus 122 for supplying a synchronous write command (SYNCWR) to an MRASR 110*a–n*;

7) a synchronous read acknowledge bus 124 for receiving an acknowledge signal (SYNCRDACK) from an MRASR 110*a–n* that a synchronous read command submitted to the MRASR 110*a–n* has been performed by the MRASR 110*a–n*; and 8) a synchronous write acknowledge bus 126 for receiving an acknowledge signal (SYNCWRACK) from an MRASR 110*a–n* that a synchronous write command submitted to the MRASR 110*a–n* has been performed by the MRASR 110*a–n*;

Preferably each synchronous read channel includes a synchronous read data bus 114, a synchronous read address bus 116, a synchronous read command bus 120 and a synchronous read acknowledge bus 124; and preferably each synchronous write channel includes a synchronous write data bus 112, a synchronous write address bus 118, a synchronous write command bus 122 and a synchronous write acknowledge bus 126. Each asynchronous channel may include one or more of:

1) an asynchronous write data bus 136 for supplying data (ASYNCWRDATA) to an MRASR 110*a–n* during an asynchronous write to the MRASR 110*a–n*;

2) an asynchronous read data bus 138 for receiving data (ASYNCRDDATA) from an MRASR 110*a–n* during an asynchronous read from the MRASR 110*a–n*;

3) an asynchronous read address bus 140 for supplying to an MRASR 110*a–n* an address (ASYNCRDADDR) of data stored within the MRASR 110*a–n* that is to be asynchronously read from the MRASR 110*a–n*;

4) an asynchronous write address bus 142 for supplying to an MRASR 110*a–n* an address (ASYNCWRADDR) of a memory location within the MRASR 110*a–n* where data is to be asynchronously written to the MRASR 110*a–n*;

5) an asynchronous read command bus 128 for supplying an asynchronous read command (ASYNCRD) to an MRASR 110*a–n*;

6) an asynchronous write command bus 130 for supplying an asynchronous write command (ASYNCWR) to an MRASR 110*a–n*;

7) an asynchronous read acknowledge bus 132 for receiving an acknowledge signal (ASYNCRDACK) from an MRASR 110*a–n* that an asynchronous read command submitted to the MRASR 110*a–n* has been performed by the MRASR 110*a–n*; and 8) an asynchronous write acknowledge bus 134 for receiving an acknowledge signal (ASYNCWRACK) from an MRASR 110*a–n* that an asynchronous write command submitted to the MRASR 110*a–n* has been performed by the MRASR 110*a–n*;

Preferably each asynchronous read channel includes an asynchronous read data bus 138, an asynchronous read address bus 140, an asynchronous read command bus 128 and an asynchronous read acknowledge bus 132; and preferably each asynchronous write channel includes an asynchronous write data bus 136, an asynchronous write address bus 142, an asynchronous write command bus 130 and an asynchronous write acknowledge bus 134.

With reference to FIG. 1, assuming each MRASR 110*a–n* has p synchronous ports and q asynchronous ports, the inventive multi-ported memory system 100 preferably includes: 1) np synchronous and nq asynchronous write data busses 112*a–np*, 136*a–nq*; 2) np synchronous and nq asynchronous read data busses 114*a–np*, 138*a–nq*; 3) np synchronous and nq asynchronous read address busses 116*a–np*, 140*a–nq*; 4) np synchronous and nq asynchronous write address busses 118*a–np*, 142*a–nq*; 5) np synchronous and nq asynchronous read command busses 120*a–np*, 128*a–nq*; 6) np synchronous and nq asynchronous write command busses 122*a–np*, 130*a–nq*; 7) np synchronous and nq asynchronous read acknowledge busses 124*a–np*, 132*a–np*; and 8) np synchronous and nq write acknowledge busses 126*a–np*, 134*a–nq*. For example, if the inventive RAM 108 is a 32 kbyte RAM with a granularity of n=32, and each MRASR has m=5 ports, two of which are synchronous (p=2) and three of which are asynchronous (q=3), for a fully wired version of the inventive multi-ported memory system 100 a total of nm=32×5=160 bus sets are required (defining 160 channels), including np=32×2=64 synchronous bus sets and nq=32×3=96 asynchronous bus sets. As described further below, the use of such a large number of busses is impractical in many circumstances (e.g., due to space requirements), and a significantly smaller number of bus sets preferably is employed (e.g., 5 to 10 bus sets).

Referring to FIG. 1, each synchronous device 102*a–x* includes a synchronous bus set 144*a–x* for sending synchronous read and write commands to the inventive memory dispatch/controller 106 and for completing synchronous read and write commands (by sending data/addresses to the inventive memory dispatch/controller 106 by receiving data, etc.), and each asynchronous device 104*a–y* includes an asynchronous bus set 146*a–y* for sending a synchronous read and write commands to the inventive memory dispatch/controller 106 and for completing asynchronous read and write commands. The inventive memory dispatch/controller 106, the inventive RAM 108 and the synchronous devices 102*a–x* all receive a system clock (CLKIN).

In general, the inventive memory dispatch/controller 106 receives synchronous requests (e.g., synchronous read and write commands) from the synchronous devices 102*a–x*, receives asynchronous requests (e.g., asynchronous read and write commands) from the asynchronous devices 104*a–y* and transfers these requests to the appropriate synchronous and asynchronous channels of the inventive RAM 108. Once a requested command has been performed by the inventive RAM 108, the inventive RAM 108 sends to the requesting device (via the inventive memory dispatch/controller 106) acknowledgment that the requested command has been performed. For example, if the inventive memory dispatch/controller 106 receives a synchronous read command from one of the synchronous devices 102*a–x*, the inventive memory dispatch/controller 106 obtains from the requesting synchronous device 102*a–x* the address of the data to be read, the inventive memory dispatch/controller 106 identifies which of the synchronous read address busses 114*a–np* is a "proper" bus for servicing the request (e.g., the inventive memory dispatch/controller 106 performs a memory mapping function to identify the appropriate MRASR address of the requested data (SYNCRDADDR) and which synchronous read address bus 114a–np services the MRASR that contains the data to be read), and the inventive memory dispatch/controller 106 transfers the address (SYNCRDADDR) to the identified synchronous read address bus 114a–np. Once the MRASR performs the read command, an acknowledge signal (SYNCRDACK) is sent from the MRASR to the inventive memory dispatch/controller 106 (via one of the synchronous read acknowledge busses 124a–np), and from the inventive memory dispatch/controller 106 to the requesting synchronous devices 102a–x (via one of the synchronous bus sets 102a–x).

If no channel exists to the appropriate MRASR (e.g., if all of the synchronous read address busses 114a–np that service the MRASR are in use), the inventive memory dispatch/controller 106 stalls the read command. The MRASR also may stall the read command as described further below. Note that stalls are unlikely to occur when a "full wired" implementation of the inventive multi-ported memory system 100 is employed, but may occur if numerous simultaneous commands are issued to the same MRASR.

If the inventive memory dispatch/controller 106 receives an asynchronous read command from one of the asynchronous devices 104a–y, the inventive memory dispatch/controller 106 performs a similar operation. The inventive memory dispatch/controller 106 obtains from the requesting asynchronous devices 104a–y the address of the data to be read, identifies which of the asynchronous read address busses 140a–nq is a "proper" bus for servicing the request, and transfers the appropriate MRASR address (ASYNCRDADDR) to the identified asynchronous read address bus 140a–nq. Once the MRASR performs the read command, an acknowledge signal (ASYNCRDACK) is sent from the MRASR to the inventive memory dispatch/controller 106 (via one of the asynchronous read acknowledge busses 132a–nq), and from the inventive memory dispatch/controller 106 to the requesting asynchronous device 104a–y (via one of the asynchronous bus sets 146a–y). If no channel exists to the appropriate MRASR (e.g., if all of the asynchronous read address busses 140a–np that service the MRASR are in use), the inventive memory dispatch/controller 106 (and/or the MRASR) stalls the read command. However, due to the independent nature of most applications running on the synchronous devices 102a–x and the asynchronous devices 104a–y, the amount of memory overlap between applications typically is small and the occurrence of stalls is rare during either synchronous or asynchronous requests.

Figure 2:
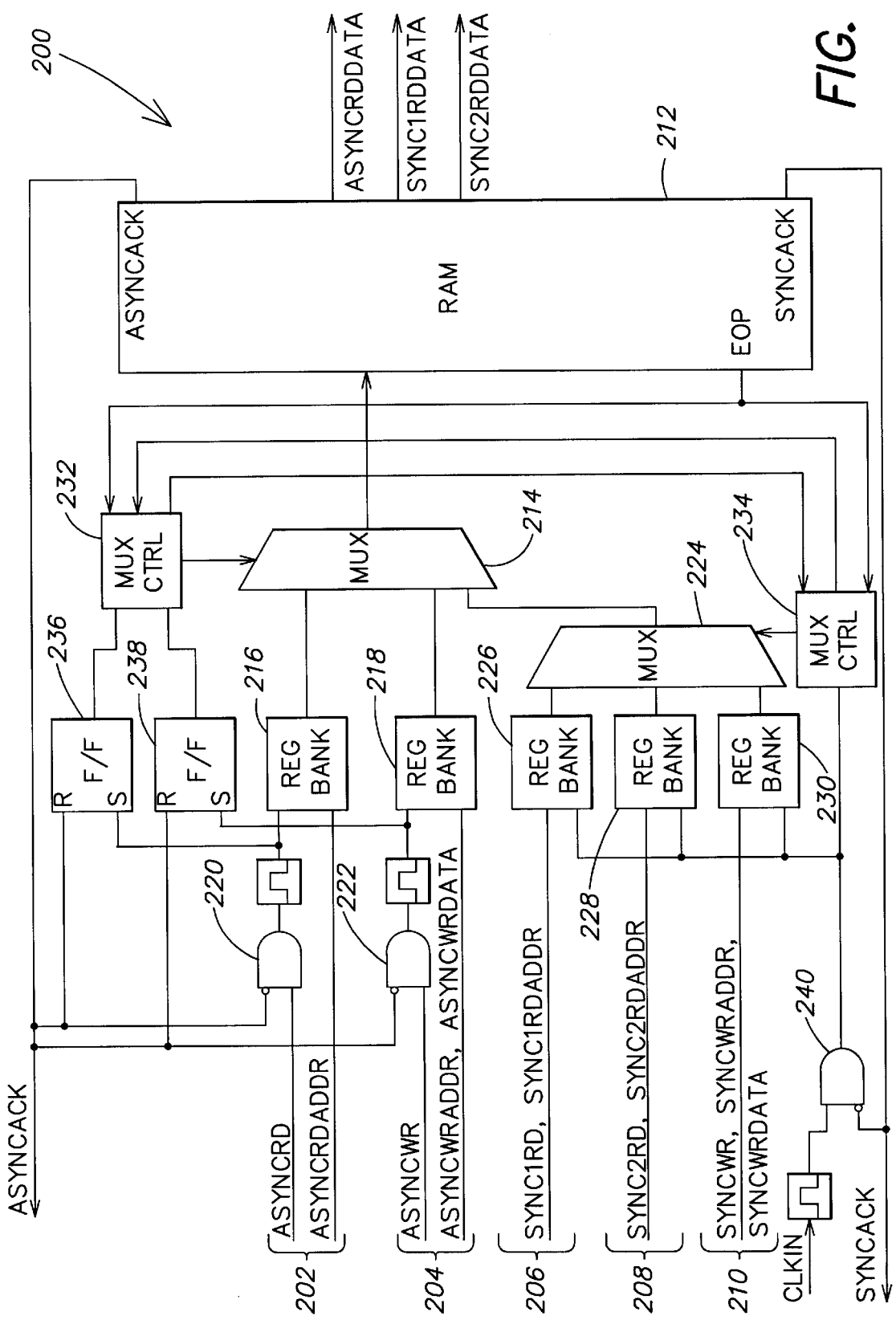
FIG. 2 is a schematic diagram of a Multi-Request Asynchronous/Synchronous RAM (MRASR) that represents a preferred embodiment for each of the MRASRs of FIG. 1.

FIG. 2 is a schematic diagram of an MRASR 200 that represents a preferred embodiment for each of the MRASRs 110a–n of FIG. 1. With reference to FIG. 2, the MRASR 200 includes two asynchronous ports (e.g., an asynchronous read port 202 and an asynchronous write port 204) and three synchronous ports (e.g., a first synchronous read port 206, a second synchronous read port 208 and a synchronous write port 210). The MRASR 200 employs a RAM 212 (e.g., a 1 kbyte RAM) which is coupled to the asynchronous ports 202 and 204 via a first multiplexer 214, a first register bank 216, a second register bank 218, a first AND gate 220 and a second AND gate 222. The RAM 212 is coupled to the synchronous ports 206–210 via the first multiplexer 214, a second multiplexer 224, a third register bank 226, a fourth register bank 228 and a fifth register bank 230. A first multiplexer control 232 (for controlling the first multiplexer 214) and a second multiplexer control 234 (for controlling the second multiplexer 224 are also provided. The first multiplexer control 232 is coupled to an output of a first flip/flop 236, to an output of a second flip flop 238, to an output of the second multiplexer control 234 and to an end-of-process (EOP) output terminal of the RAM 212. The second multiplexer control 234 is coupled to an output of the first multiplexer control 232, to the EOP output terminal of the RAM 212 and to an output of a third AND gate 240.

In operation, synchronous and asynchronous requests from the synchronous devices 102a–x and the asynchronous devices 104a–y are submitted to the MRASR 200 by the inventive memory dispatch/controller 106. As described below, the inventive memory dispatch/controller 106 preferably monitors each MRASR to ensure that requests are not submitted to channels of an MRASR when the channels are busy. With reference to the MRASR 200 of FIG. 2, the inventive memory dispatch/controller 106 preferably monitors an ASYNCACK output of the RAM 212 and ensures that the ASYNCACK output of the RAM 212 is inactive (e.g., has a low logic level) prior to submitting an asynchronous request to the MRASR 200. The inventive memory dispatch/controller 106 also monitors a SYNCACK output of the RAM 212 and preferably ensures that the SYNCACK output of the RAM 212 is inactive (e.g., has a low logic level) prior to submitting an synchronous request to the MRASR 200. As described below with reference to FIGS. 3–6E, the inventive memory dispatch/controller 106 also monitors the ASYNCACK/SYNCACK output when it sends an asynchronous/synchronous request to an MRASR so as to ensure that an acknowledgment signal has been received from the MRASR (indicating that the requested function has been performed) prior to submitting an additional asynchronous/synchronous request to the MRASR.

When the ASYNCACK output is active (e.g., has a high logic level), the asynchronous read port 202 is gated off by the first AND gate 220 and the asynchronous write port 204 is gated off by the second AND gate 222; and when the SYNCACK output is active, the CLKIN signal is gated off by the third AND gate 240 so that the first synchronous read port 206, the second synchronous read port 208 and the synchronous write port 210 cannot be latched by the third register bank 226, the second register bank 228 and the third register bank 230, respectively. Note that in general, a separate ASYNCACK output and a separate SYNCACK output may be provided for each port of an MRASR (e.g., as shown in FIG. 1). However, for the MRASR 200 of FIG. 2 a single ASYNCACK output is employed for the asynchronous ports 202 and 204 and a single SYNCACK output is employed for the synchronous ports 206–210.

Assuming no synchronous stalls have occurred (e.g., the SYNCACK is inactive), the rising edge of CLKIN latches any active request signals present on the first synchronous read port 206, the second synchronous read port 208 and the synchronous write port 210 into the third register bank 226, the fourth register bank 228 and the fifth register bank 230, respectively (e.g., to latch in address and write data). Thereafter, if neither of the asynchronous read port 202 or the asynchronous write port 204 contains an active asynchronous request, the second multiplexer control 234 and the first multiplexer control 232 direct the second multiplexer 224 and the first multiplexer 214 to submit to the RAM 212 any synchronous commands latched by the register banks 226–230. Synchronous requests are submitted to the RAM 212 in a predetermined order set by the second multiplexer control 234.

In the event of an asynchronous request on the asynchronous read port 202 and/or the asynchronous write port 204, assuming the ASYNCACK output is not active, address and write data (if any) are latched into the first register bank 216 and/or the second register bank 218. In response to data being latched into the first register bank 216, the first flip/flop 236 is set, and in response to data being latched by the second register bank 218, the second flip/flop 238 is set. The set state of the first flip/flop 236 and/or the second flip/flop 238 directs the first multiplexer control 232 to submit any latched asynchronous requests to the RAM 212 as soon as ongoing operations of the RAM 212 are complete (e.g., when the EOP output of the RAM 212 is inactive). The asynchronous ports 202 and 204 thus have priority over the synchronous ports 206–210, and any synchronous requests latched within the third register bank 226, the second register bank 228 and/or the third register bank 230 are stalled by the first multiplexer control 232 and/or the second multiplexer control 234 until the asynchronous requests are completed.

Preferably the asynchronous ports 202 and 204 are continuously polled, and asynchronous port operations are initiated upon going active (e.g., regardless of the state of CLKIN). If there is an ongoing port operation, an asynchronous request will commence as soon as the ongoing port operation is completed (e.g., as indicated by an inactive EOP signal). As stated, any synchronous requests preferably are stalled until all asynchronous requests have been satisfied. Further, assuming synchronous operations are not stalled, if synchronous requests are present on all three of the synchronous ports 206–210, the synchronous request on the first synchronous read port 206 preferably is performed first, the synchronous request on the second synchronous read port 208 preferably is performed second and the synchronous request on the synchronous write port 210 preferably is performed third.

It will be understood that the particular priority scheme employed by the MRASR 200 (e.g., asynchronous requests having higher priority than synchronous requests) is arbitrary, and that synchronous requests may be given a higher priority than asynchronous requests. A significant advantage of the multiplexed structure of the MRASR 200 is the ease with which its priority scheme may be modified.

As described previously, the use of the large number of busses required for a fully wired implementation of the inventive multi-ported memory system 100 is impractical in many circumstances. For example, assume the inventive RAM 108 is a 32 kbyte RAM with 32 MRASRs. If eight bus sets are available, then the eight bus sets might be configured as follows: two bus sets service MRASRs 1–8, two bus sets service MRASRs 9–16, two bus sets service MRASRs 17–24 and two bus sets service MRASRs 25–32. The actual allocation of bus sets may vary, but preferably is selected based on the memory usage of the synchronous devices 102a–x and the asynchronous devices 104a–y. Preferably the bus set allocation may be dynamically varied (e.g., via hardware, software or a combination thereof).

In the preferred configuration of the inventive multi-ported memory system 100, the inventive memory dispatch/controller 106 retains information about the size of each MRASR 110a–n, the granularity of the inventive RAM 108, the number of busses available to communicate asynchronous and synchronous requests to each MRASR, and the memory mapping required to translate asynchronous/synchronous address reads and writes to the appropriate MRASRs. The inventive memory dispatch/controller 106 may also set a priority between asynchronous and synchronous requests (e.g., by submitting to the RAM 108 synchronous requests before asynchronous requests, or vice versa).

Figure 3:
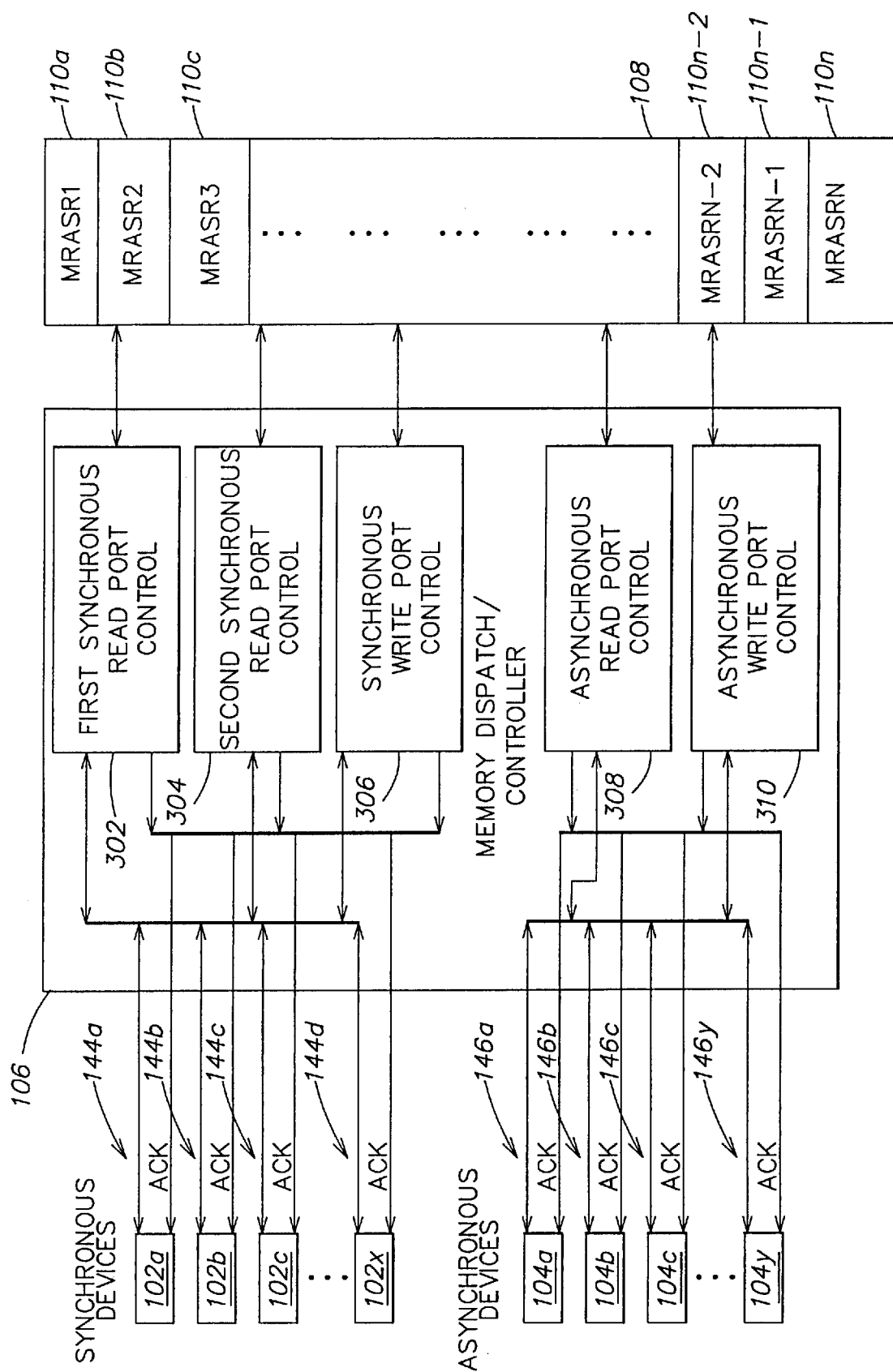
FIG. 3 is a schematic diagram of a preferred embodiment for the memory dispatch/controller of FIG. 1.

FIG. 3 is a schematic diagram of a preferred embodiment for the memory dispatch/controller 106 of FIG. 1. In the embodiment of FIG. 3, each MRASR 110a–n is assumed to employ three synchronous ports (a first synchronous read port, a second synchronous read port and a synchronous write port) and two asynchronous ports (an asynchronous read port and an asynchronous write port). Other configurations with other numbers of synchronous and asynchronous ports also may be employed.

With reference to FIG. 3, the memory dispatch/controller 106 comprises a first synchronous read port control 302, a second synchronous read port control 304 and a synchronous write port control 306 each coupled to the synchronous devices 102a–x and to the RAM 108, and an asynchronous read port control 308 and an asynchronous write port control 310 each coupled to the asynchronous devices 104a–y and to the RAM 108. The first synchronous read port control 302 controls the transfer of synchronous memory requests (synchronous reads from the synchronous devices 102a–x) and acknowledgments between the memory dispatch/controller 106 and the first synchronous read port (not shown) of each of the MRASRs 110a–n. Specifically, the first synchronous read port control 302 selects the appropriate MRASR of the RAM 108 for a given synchronous memory request, transfers the memory request to the selected MRASR, receives acknowledgment of the MRASR execution of the synchronous memory request, and communicates the acknowledgment to the requesting synchronous device. The second synchronous read port control 304, the synchronous write port control 306, the asynchronous read port control 308 and the asynchronous write port control 310 perform similar operations with regard to synchronous reads and the second synchronous read port of an MRASR, synchronous writes and the synchronous write port of an MRASR, asynchronous reads and the asynchronous read port of an MRASR, and asynchronous writes and the asynchronous write port of an MRASR, respectively.

Figure 4:
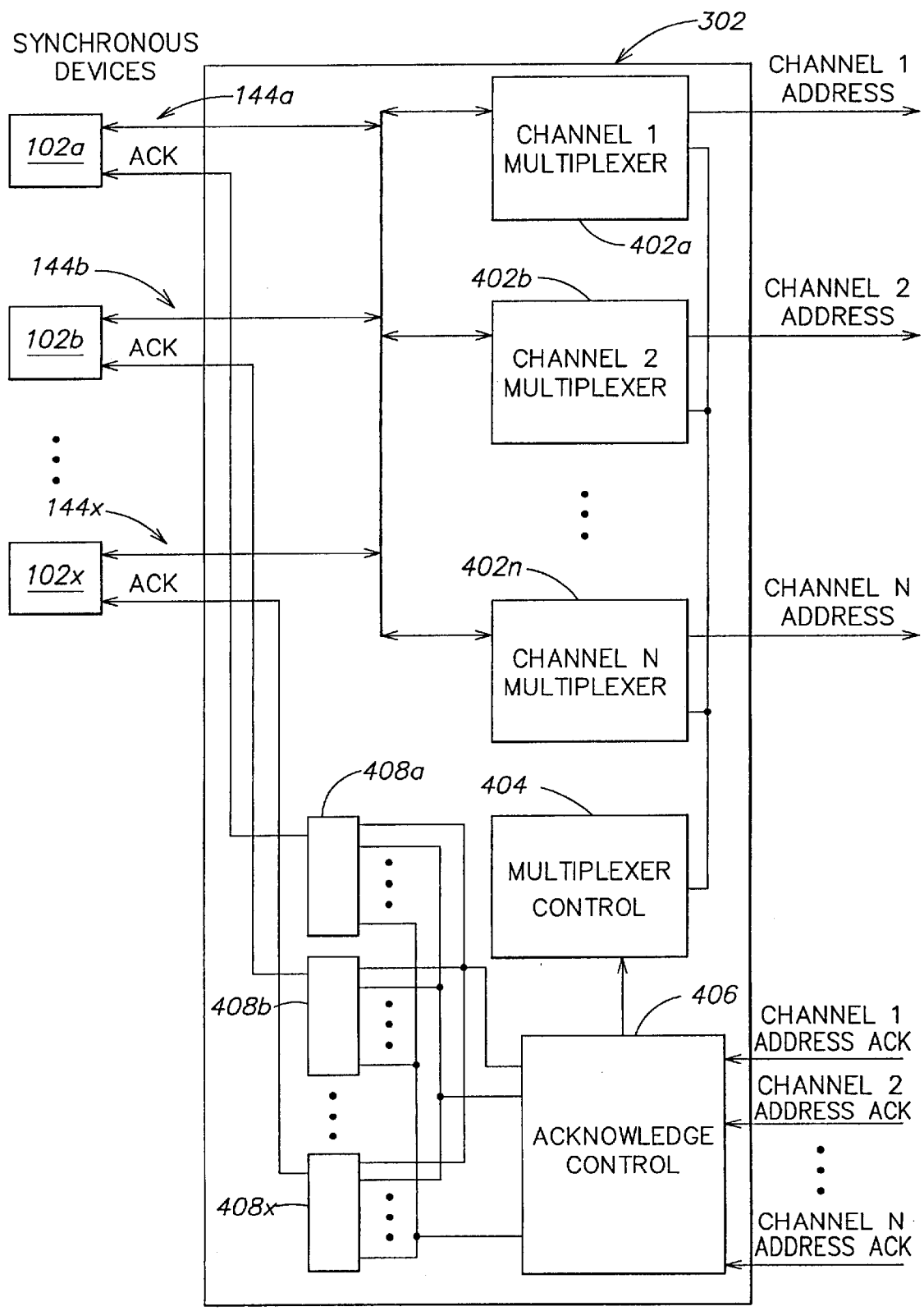
FIG. 4 is a schematic diagram of a preferred embodiment of the first synchronous read port control of FIG. 3.

FIG. 4 is a schematic diagram of a preferred embodiment of the first synchronous read port control 302 of FIG. 3. The second synchronous read port control 304, the synchronous write port control 306, the asynchronous read port control 308 and the asynchronous write port control 310 preferably are configured similarly and, therefore, are not described further herein. With reference to FIG. 4, the first synchronous read port control 302 comprises a plurality of channel multiplexers 402a–n, each coupled to the synchronous bus set 144a–x of each of the synchronous devices 102a–x and to the first synchronous read port (not shown) of each MRASR 110a–n, respectively. The first synchronous read port control 302 also comprises a multiplexer control 404 coupled to the channel multiplexers 402a–n (for controlling the operation thereof), and an acknowledgment control circuit 406 coupled to the first synchronous read port of each MRASR 110a–n and to the synchronous bus set 144a–x of each of the synchronous devices 102a–x (via a plurality of acknowledgment multiplexers 408a–x).

In operation, a synchronous memory read request from one of the synchronous devices 102a–x is decoded by the memory dispatch/controller 106, and if the first synchronous read port of an MRASR is to employed to execute the synchronous memory read, the memory dispatch/controller 106 decodes the upper bits of the memory request to determine which channel is requested by the device. If more than one memory request competes for the same channel, the multiplexer control 404 prioritizes the memory requests. Additionally, the multiplexer control 404 ensures that the requested channel is not in use (e.g., is not servicing a previously submitted request). For example, after submitting a synchronous memory read request to an MRASR via a channel, the multiplexer control 404 monitors the channel (e.g., via the acknowledgment control circuit 406) to determine whether the submitted synchronous memory read request has been executed (e.g., and that the channel is now free). If the requested channel is in use, the memory dispatch/controller 106 stalls the synchronous memory read request until the channel is free. Each synchronous memory read acknowledgment from an MRASR is transmitted from the acknowledgment control circuit 406 to the acknowledgment multiplexers 408a–x, and from the acknowledgment multiplexers 408a–x to the requesting device.

Note that in general each of the synchronous devices 102a–x and each of the asynchronous devices 104a–y is capable of requesting the entire address range of the RAM 108. The memory dispatch/controller 106 decodes the upper bits of each requesting device to determine which channel is requested by the device. If any previous requests for the same channel have not been acknowledged, the memory dispatch/controller 106 stalls the requesting device. However, if the requested channel is free (or becomes free), the memory dispatch/controller 106 routes the requested address over the channel and the request is executed by the appropriate MRASR.

If two devices request access to addresses that are in different MRASR channel boundaries, no channel conflict exists, and the requests may be handled simultaneously whether synchronous or asynchronous. However, if two devices request the same channel on the same cycle, the memory dispatch/controller 106 only services one of the devices and stalls the other device. By keeping the number of available channels high and separate for both asynchronous and synchronous requests, the potential for channel conflicts is greatly reduced.

Figure 5A:
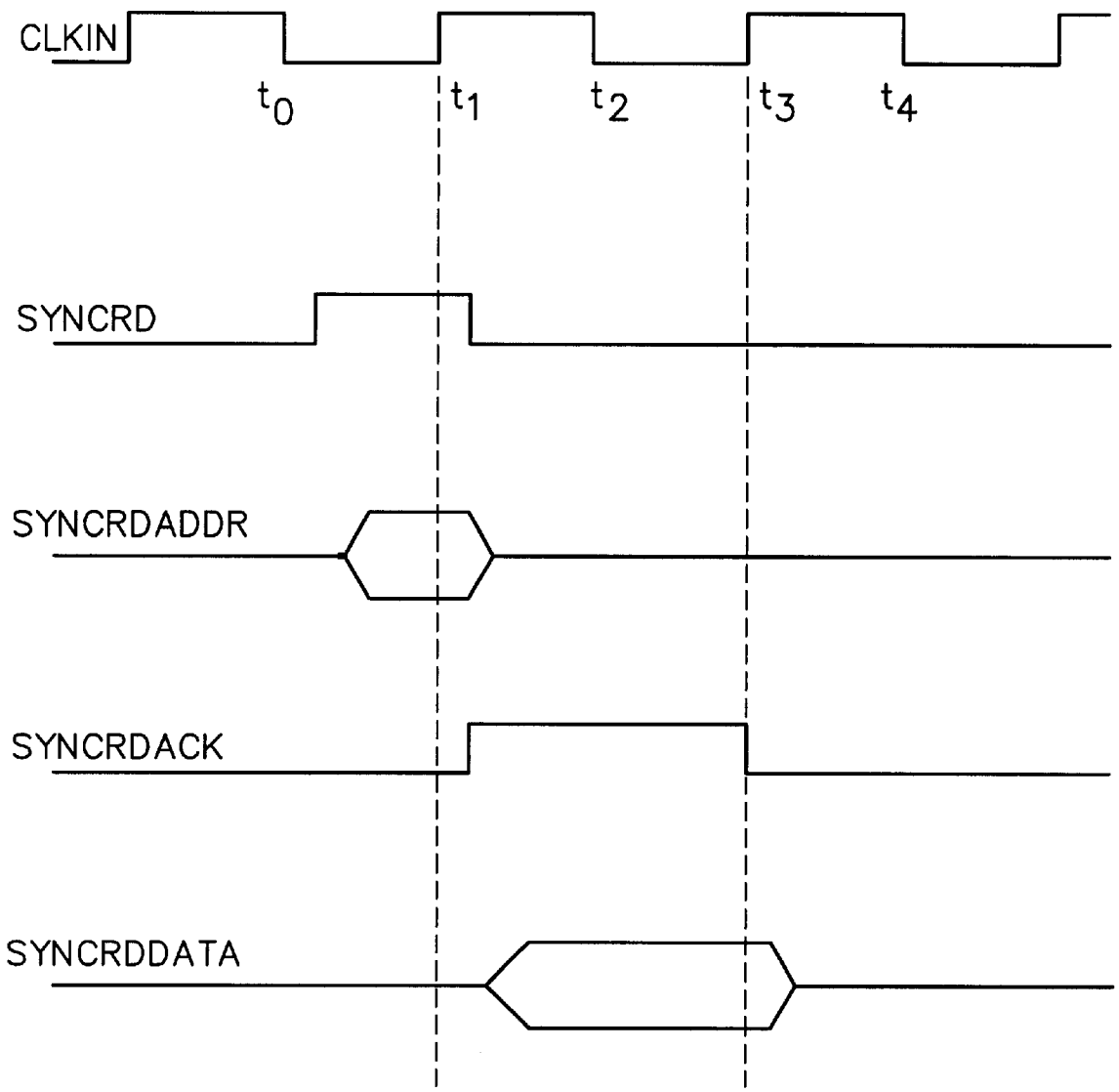
FIGS. 5A–5E are timing diagrams of the operation of the inventive multi-ported memory system of FIG. 1 during synchronous read and write operations.

FIGS. 5A–5E are timing diagrams of the operation of the inventive multi-ported memory system 100 of FIG. 1 during synchronous read and write operations. With reference to FIG. 1 and FIG. 5A, after one of the synchronous devices 102a–x issues a synchronous read command (SYNCRD) to the inventive memory dispatch/controller 106, the inventive memory dispatch/controller 106 identifies which of the MRASRs 110a–n of the inventive RAM 108 contains the data to be read, selects a channel to the identified MRASR and transmits the synchronous read command (SYNCRD) to the MRASR. At time $t_1$ the identified MRASR receives the read command (SYNCRD) and the address of the requested data (SYNCRDADDR), and shortly thereafter acknowledges execution of the read command (SYNCRDACK). The requested data (SYNCRDDATA) is placed on the appropriate synchronous read data bus for transfer to the inventive memory dispatch/controller 106 and then to the requesting synchronous device.

Figure 5B:
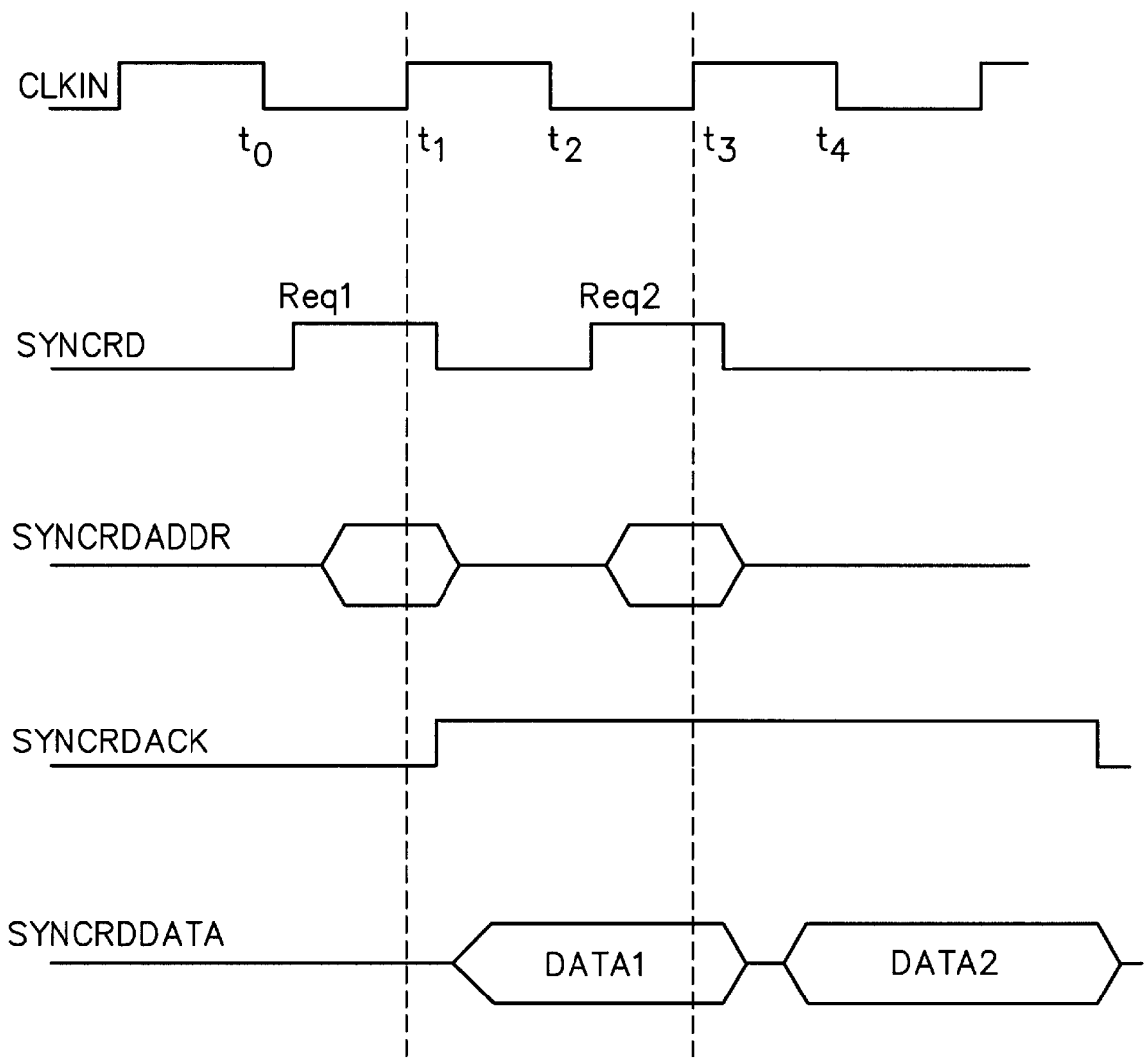

In FIG. 5B, first and second synchronous read commands are issued to the inventive memory dispatch/controller 106, one after another, by one or more of the synchronous devices 102a–x. In response thereto, the inventive memory dispatch/controller 106 transmits the first synchronous read command to the appropriate MRASR. At time $t_1$ the MRASR receives the first synchronous read command (SYNCRD) and the address of the requested data (SYNCRDADDR), and shortly thereafter acknowledges execution of the first read command (SYNCRDACK). The requested data (SYNCRDDATA) is placed on the appropriate synchronous read data bus for transfer to the inventive memory dispatch/controller 106 and to the requesting device. After receiving the acknowledgment of execution of the first synchronous read command, the second synchronous read command (SYNCRD) is submitted to the MRASR, and at time $t_3$ the MRASR receives the second synchronous read command (SYNCRD) and the address of the requested data (SYNCRDADDR). Shortly thereafter the MRASR acknowledges execution of the second synchronous read command (SYNCRDACK), and the requested data (SYNCRDDATA) is placed on the appropriate synchronous read data bus for transfer to the inventive memory dispatch/controller 106 and to the requesting device. Note that the inventive memory dispatch/controller 106 keeps track of whether a previous request sent to a port of an MRASR has been acknowledged by the MRASR and preferably will not send another request to the port until the port is available (e.g., after receiving an acknowledgment from the MRASR associated with the port).

Figure 5C:
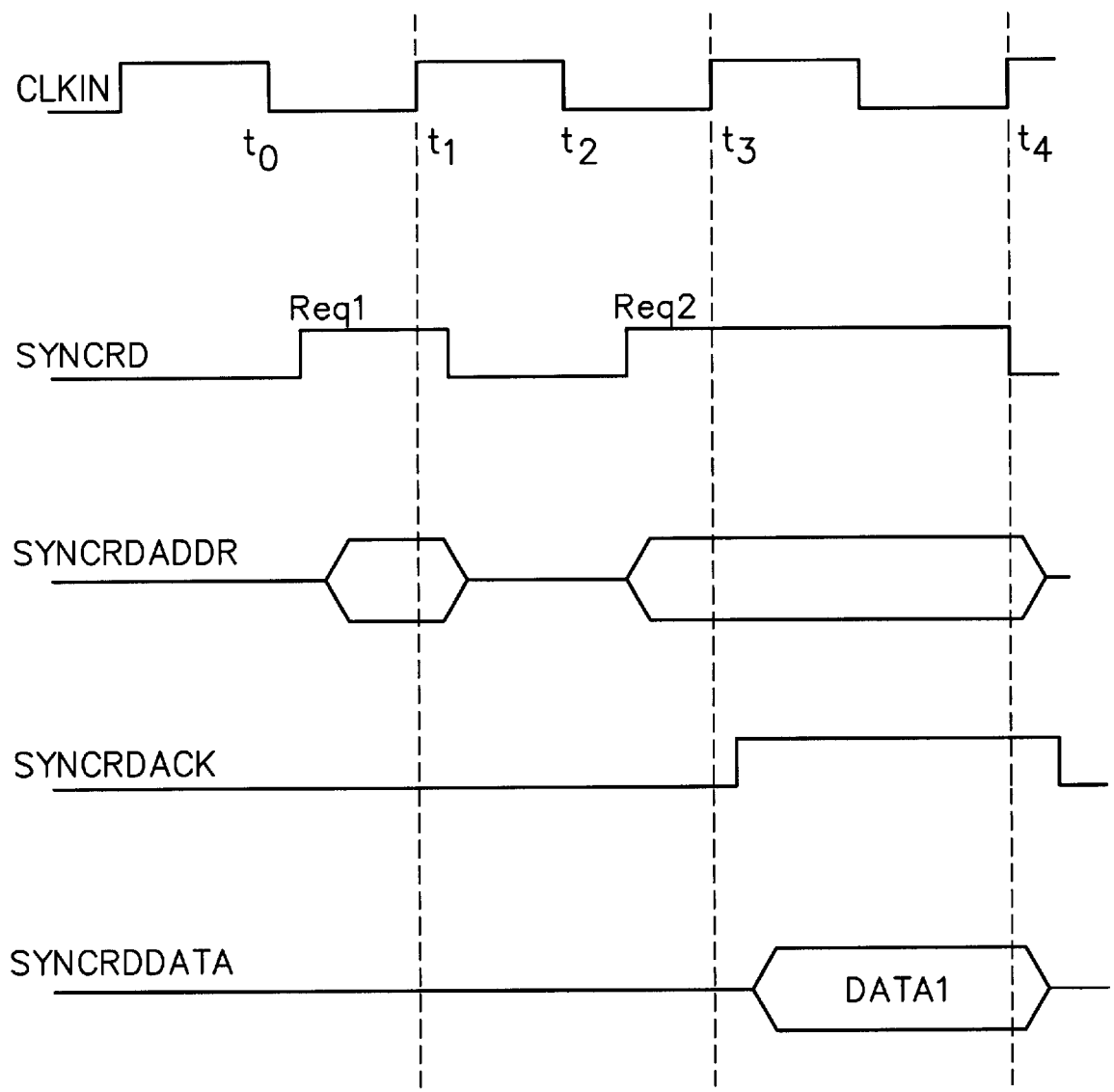
Figure 5D:
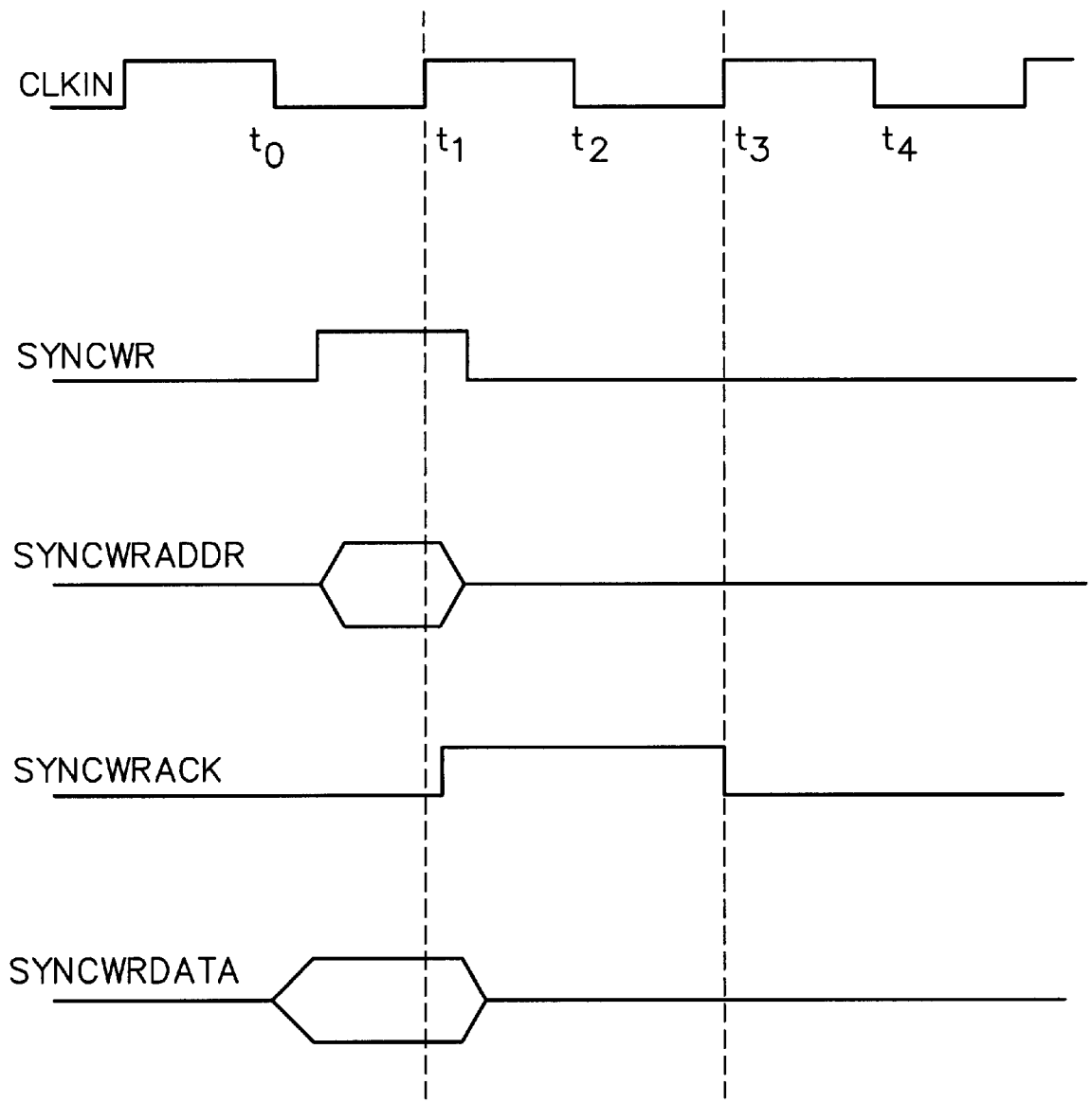
Figure 5E:
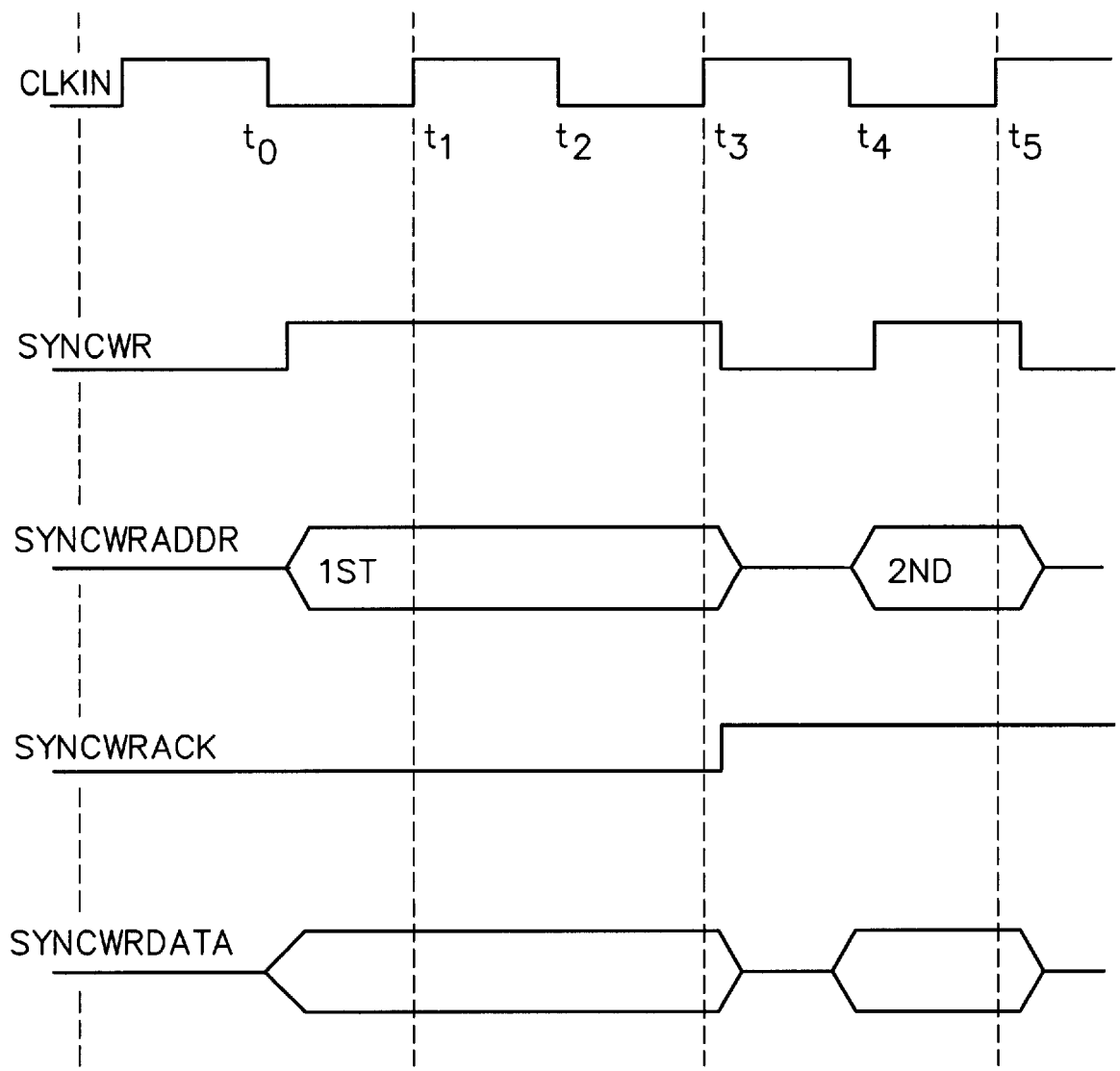
Figure 6A:
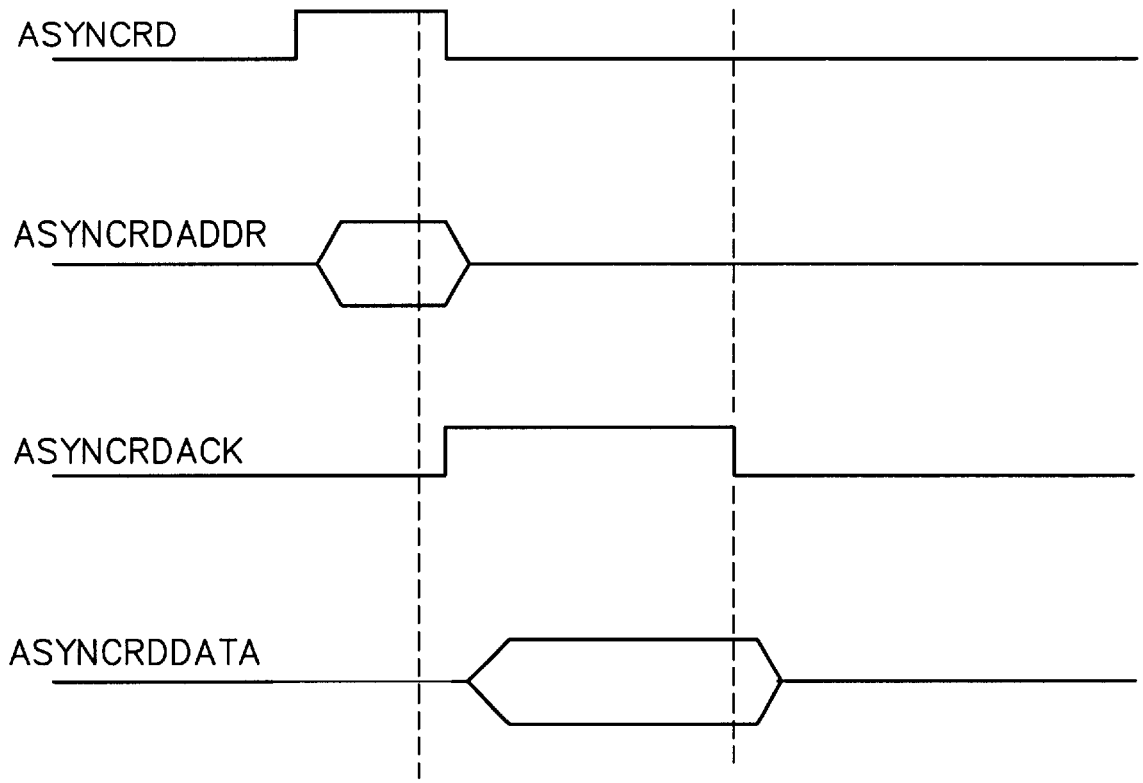
FIGS. 6A–6E are timing diagrams of the operation of the inventive multi-ported memory system of FIG. 1 during asynchronous read and write operations.
Figure 6B:
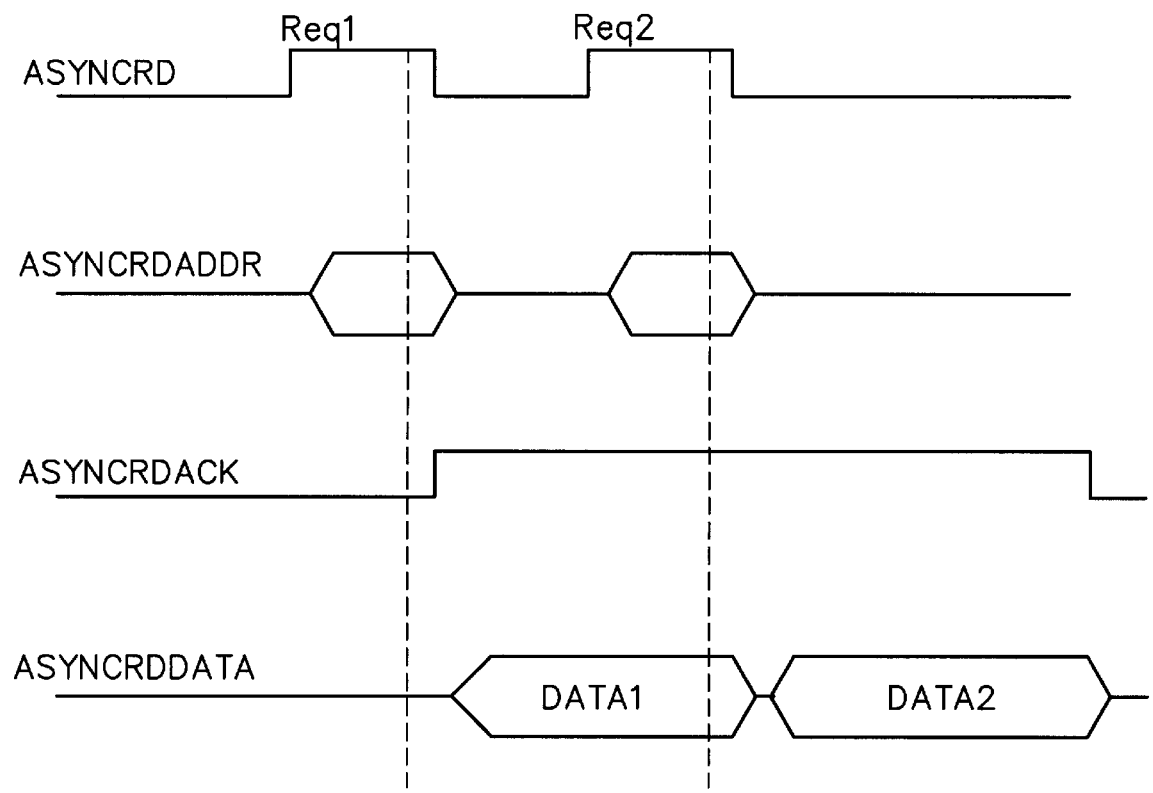
Figure 6C:
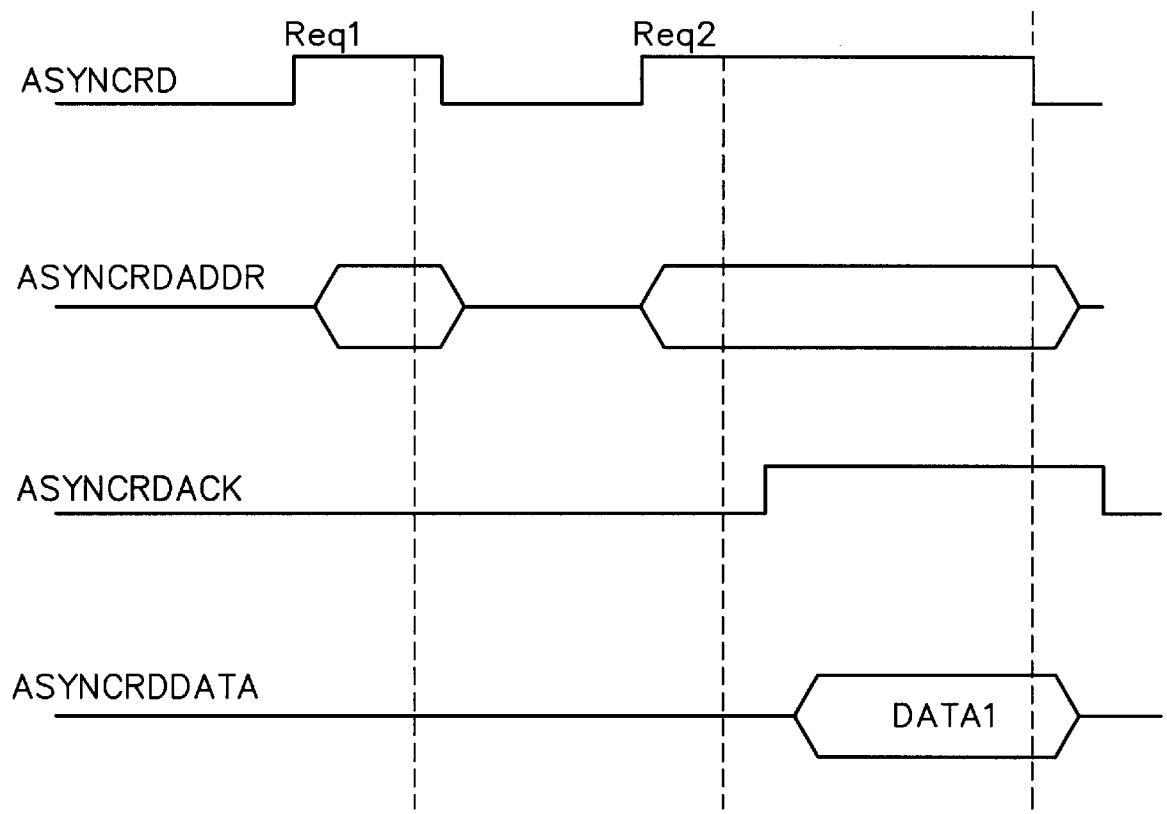
Figure 6D:
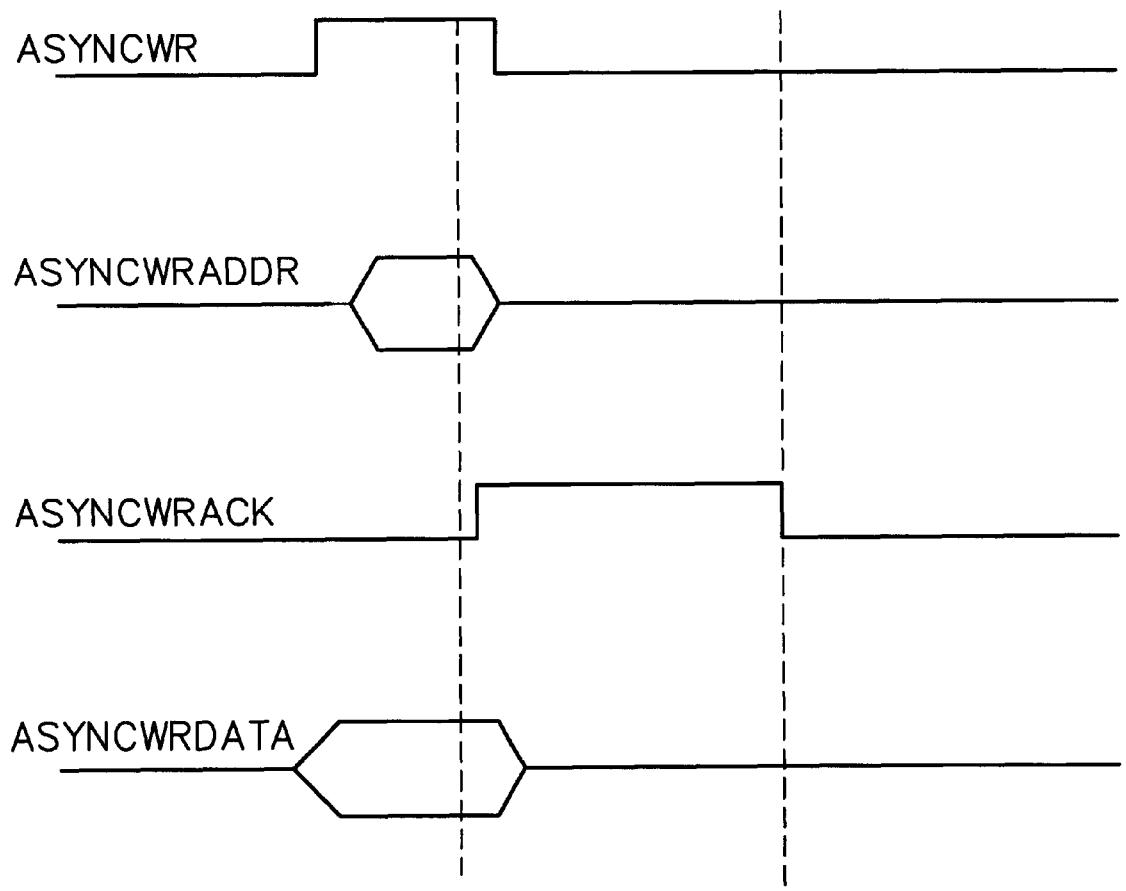
Figure 6E:
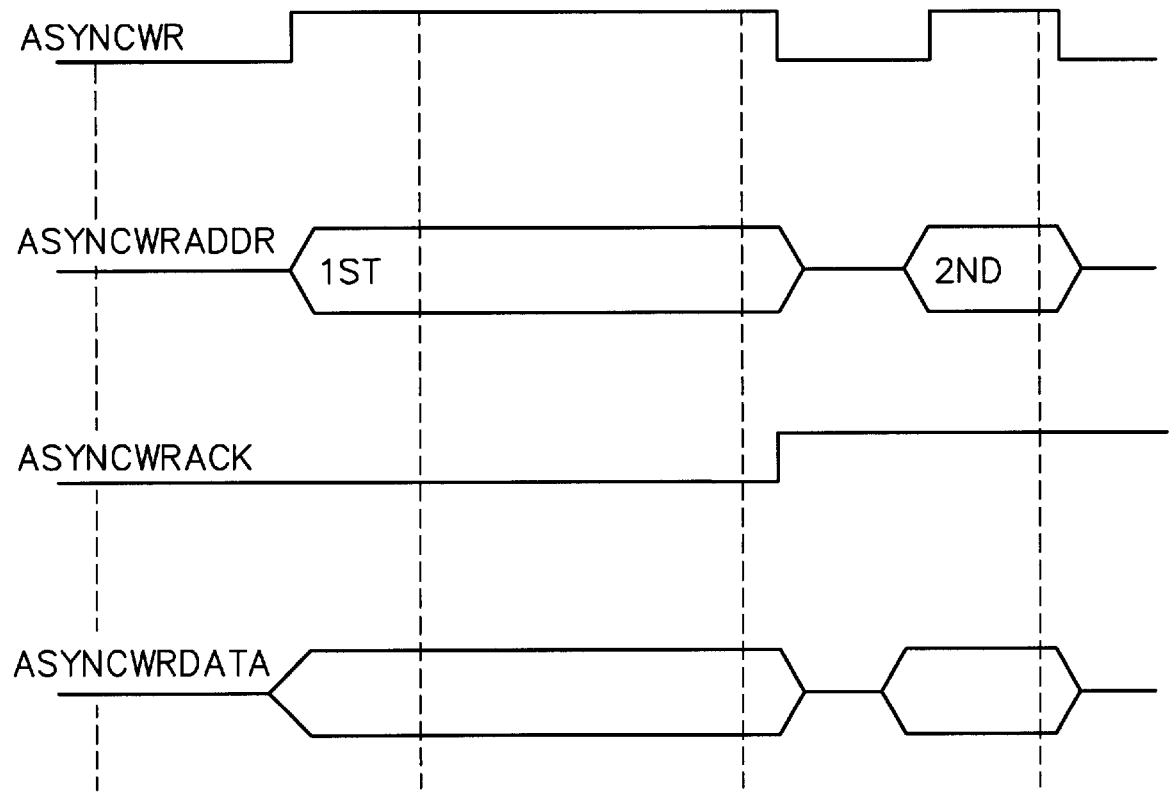

FIG. 5C illustrates a timing diagram that is similar to the timing diagram of FIG. 5B. However, in the timing diagram of FIG. 5C, the first synchronous read command (SYNCRD) is not immediately acknowledged (e.g., the MRASR is stalled). Accordingly, the inventive memory dispatch/controller 106 stalls, and continues to output the second asynchronous read command (SYNCRD) to the MRASR until the MRASR acknowledges the completion of the first synchronous read command at time $t_4$. FIGS. 5D and 5E illustrate the similar operation of the inventive multi-ported memory system 100 of FIG. 1 during an unstalled (FIG. 5D) and a stalled (FIG. 5E) synchronous write request. FIGS. 6A–6E illustrate asynchronous read and write operations of the inventive multi-ported memory system 100 that are similar to the synchronous read and write operations described with reference to FIGS. 5A–5E.

The foregoing description discloses only the preferred embodiments of the invention, modifications of the above disclosed apparatus and method which fall within the scope of the invention will be readily apparent to those of ordinary skill in the art. For instance, any size RAM 108 may be employed with any number of MRASRs (having any number of ports) and with any number of channels.

Accordingly, while the present invention has been disclosed in connection with the preferred embodiments thereof, it should be understood that other embodiments may fall within the spirit and scope of the invention, as defined by the following claims.

The invention claimed is:

1. A multi-port memory comprising:

means for receiving synchronous memory requests;

means for receiving asynchronous memory requests; and means for processing the received synchronous and asynchronous memory requests simultaneously;

wherein the means for receiving synchronous memory requests and the means for receiving asynchronous memory requests comprise memory dispatch means for receiving synchronous and asynchronous memory requests, transferring synchronous memory requests to a multi-port memory array via synchronous memory channels, and transferring asynchronous memory requests to the multi-port memory array via asynchronous memory channels.

2. The multi-port memory of claim 1 wherein the means for processing the received synchronous and asynchronous requests simultaneously comprises memory means coupled to the memory dispatch means, the memory means comprising:

means for receiving synchronous memory requests from the memory dispatch means;

means for executing received synchronous memory requests;

means for sending acknowledgment of executed synchronous memory requests to the memory dispatch means;

means for receiving asynchronous memory requests from the memory dispatch means;

means for executing received asynchronous memory requests; and means for sending acknowledgment of executed asynchronous memory requests to the memory dispatch means.

3. The multi-port memory of claim 2 wherein the memory means further comprises:

priority means for defining a priority scheme between execution of received synchronous memory requests and execution of received asynchronous memory requests.

4. A multi-ported memory device comprising:

a memory dispatch/controller adapted to receive synchronous memory requests from at least one synchronous device and to receive asynchronous memory requests from at least one asynchronous device; and a memory circuit having a plurality of multi-request memory arrays coupled to the memory dispatch/controller, each multi-request memory array having:
- a plurality of synchronous ports adapted to receive synchronous memory requests from the memory/dispatch controller;
- a plurality of asynchronous ports adapted to receive asynchronous memory requests from the memory/dispatch controller;
- request processing circuitry coupled to the plurality of synchronous ports and to the plurality of asynchronous ports, the request processing circuitry adapted to process synchronous and asynchronous memory requests received via the synchronous and asynchronous ports; and
- a memory array coupled to the request processing circuitry.

5. The multi-ported memory device of claim 4 wherein the request processing circuitry comprises:

a first plurality of storage devices coupled to the plurality of synchronous ports and adapted to store synchronous memory requests present on the synchronous ports;

a second plurality of storage devices coupled to the plurality of asynchronous ports and adapted to store asynchronous memory requests present on the asynchronous ports; and priority circuitry coupled to the first and the second plurality of storage devices and to the memory array, the priority circuitry adapted to prioritize execution by the memory array of synchronous memory requests stored within the first plurality of storage devices and of asynchronous memory requests stored within the second plurality of storage devices.

6. The multi-ported memory device of claim 5 wherein the priority circuitry comprises:

a first selection circuit coupled to the first plurality of storage devices and adapted to select between synchronous memory requests stored in the first plurality of storage devices; and a second selection circuit coupled to the second plurality of storage devices and to the first selection circuit, the second selection circuit adapted to select between asynchronous memory requests stored in the second plurality of storage devices and a synchronous memory request selected by the first selection circuit.

7. The multi-ported memory device of claim 6 wherein the first selection circuit comprises:

a first multiplexer coupled to the first plurality of storage devices; and a first multiplexer controller coupled to the first multiplexer and adapted to control an operation of the first multiplexer.

8. The multi-ported memory device of claim 7 wherein the second selection circuit comprises:

a second multiplexer coupled to the second plurality of storage devices and to the first multiplexer; and a second multiplexer controller coupled to the second multiplexer and to the first multiplexer controller, the second multiplexer controller adapted to control an operation of the second multiplexer.

9. The multi-ported memory device of claim 4 wherein the at least one multi-request memory array further comprises:

gating circuitry coupled to the plurality of synchronous ports, to the plurality of asynchronous ports and to the memory array, the gating circuitry adapted to block at least one of the plurality of the synchronous ports and at least one of the plurality of the asynchronous ports during execution of a memory request by the memory array.

10. The multi-ported memory device of claim 4 wherein the memory circuit comprises 32 kbytes of memory and wherein the plurality of multi-request memory arrays comprises 32 multi-request memory arrays.

11. The multi-ported memory device of claim 4 wherein each multi-request memory array comprises:

a first synchronous read port;

a second synchronous read port;

a synchronous write port;

an asynchronous read port; and an asynchronous write port.

12. A memory circuit comprising:

a plurality of multi-request memory arrays, each multi-request memory array comprising:
- a plurality of synchronous ports adapted to receive synchronous memory requests from a memory/dispatch controller;
- a plurality of asynchronous ports adapted to receive asynchronous memory requests from the memory/dispatch controller;
- request processing circuitry coupled to the plurality of synchronous ports and to the plurality of asynchronous ports, the request processing circuitry adapted to process synchronous and asynchronous memory requests received via the synchronous and asynchronous ports; and
- a memory array coupled to the request processing circuitry.

13. The memory circuit of claim 12 wherein the request processing circuitry comprises:

a first plurality of storage devices coupled to the plurality of synchronous ports and adapted to store synchronous memory requests present on the synchronous ports;

a second plurality of storage devices coupled to the plurality of asynchronous ports and adapted to store asynchronous memory requests present on the asynchronous ports; and priority circuitry coupled to the first and the second plurality of storage devices and to the memory array, the priority circuitry adapted to prioritize execution by the memory array of synchronous memory requests stored within the first plurality of storage devices and of asynchronous memory requests stored within the second plurality of storage devices.

14. A method of processing asynchronous and synchronous memory requests comprising:

providing a memory device having a memory circuit comprises a plurality of multi-request memory arrays, each multi-request memory array having a plurality of synchronous ports and a plurality of asynchronous ports;

receiving a synchronous memory request;

selecting one of the plurality of multi-request memory arrays that can service the synchronous memory request;

transferring the synchronous memory request to the selected multi-request memory array;

receiving an asynchronous memory request;

selecting one of the plurality of multi-request memory arrays that can service the asynchronous memory request; and transferring the asynchronous memory request to the selected multi-request memory array.

15. The method of claim 14 wherein transferring the synchronous memory request to the selected multi-request memory array comprises determining if the selected one of the plurality of multi-request memory arrays that can service the synchronous memory request is busy, and if so, delaying transferring the synchronous memory request to the selected multi-request memory array until the selected multi-request memory array is no longer busy.

16. The method of claim 14 further comprising determining if the selected one of the plurality of multi-request memory arrays that can service the synchronous memory request and the selected one of the plurality of multi-request memory arrays that can service the asynchronous memory request are the same multi-request memory array, and if so, prioritizing the execution of the synchronous and asynchronous memory requests.

17. A multi-ported memory device comprising:

a memory dispatch/controller adapted to receive synchronous memory requests from at least one synchronous device and to receive asynchronous memory requests from at least one asynchronous device; and a memory circuit having at least one multi-request memory array coupled to the memory dispatch/controller;

wherein the at least one multi-request memory array includes:

a plurality of synchronous ports and a plurality of asynchronous ports adapted to receive synchronous and asynchronous memory requests, respectfully, from the memory/dispatch controller;

request processing circuitry coupled to the plurality of synchronous ports and to the plurality of asynchronous ports; and a memory array coupled to the request processing circuitry;

and wherein the request processing circuitry comprises:

a first plurality of storage devices coupled to the plurality of synchronous ports and adapted to store synchronous memory requests present on the synchronous ports;

a second plurality of storage devices coupled to the plurality of asynchronous ports and adapted to store asynchronous memory requests present on the asynchronous ports; and priority circuitry coupled to the first and the second plurality of storage devices and to the memory array, the priority circuitry adapted to prioritize execution by the memory array of synchronous memory requests stored within the first plurality of storage devices and of asynchronous memory requests stored within the second plurality of storage devices.

18. The multi-ported memory device of claim 17 wherein the priority circuitry comprises:

a first selection circuit coupled to the first plurality of storage devices and adapted to select between synchronous memory requests stored in the first plurality of storage devices; and a second selection circuit coupled to the second plurality of storage devices and to the first selection circuit, the second selection circuit adapted to select between asynchronous memory requests stored in the second plurality of storage devices and a synchronous memory request selected by the first selection circuit.

19. The multi-ported memory device of claim 18 wherein the first selection circuit comprises:

a first multiplexer coupled to the first plurality of storage devices; and a first multiplexer controller coupled to the first multiplexer and adapted to control an operation of the first multiplexer.

20. The multi-ported memory device of claim 19 wherein the second selection circuit comprises:

a second multiplexer coupled to the second plurality of storage devices and to the first multiplexer; and a second multiplexer controller coupled to the second multiplexer and to the first multiplexer controller, the second multiplexer controller adapted to control an operation of the second multiplexer.

21. The multi-ported memory device of claim 17 wherein the memory circuit comprises a plurality of multi-request memory arrays.

22. A multi-ported memory device comprising:

a memory dispatch/controller adapted to receive synchronous memory requests from at least one synchronous device and to receive asynchronous memory requests from at least one asynchronous device; and a memory circuit having at least one multi-request memory array coupled to the memory dispatch/controller, the at least one multi-request memory array having:

a plurality of synchronous ports adapted to receive synchronous memory requests from the memory/dispatch controller;

a plurality of asynchronous ports adapted to receive asynchronous memory requests from the memory/dispatch controller;

request processing circuitry coupled to the plurality of synchronous ports and to the plurality of asynchronous ports, the request processing circuitry adapted to process synchronous and asynchronous memory requests received via the synchronous and asynchronous ports;

a memory array coupled to the request processing circuitry; and gating circuitry coupled to the plurality of synchronous ports, to the plurality of asynchronous ports and to the memory array, the gating circuitry adapted to block at least one of the plurality of the synchronous ports and at least one of the plurality of the asynchronous ports during execution of a memory request by the memory array.

23. The multi-ported memory device of claim 22 wherein the memory circuit comprises a plurality of multi-request memory arrays.

24. A memory circuit comprising:

at one multi-request memory array, the at least one multi-request memory array comprising:
- a plurality of synchronous ports adapted to receive synchronous memory requests from a memory/dispatch controller;
- a plurality of asynchronous ports adapted to receive asynchronous memory requests from the memory/dispatch controller;
- request processing circuitry coupled to the plurality of synchronous ports and to the plurality of asynchronous ports, the request processing circuitry adapted to process synchronous and asynchronous memory requests received via the synchronous and asynchronous ports; and
- a memory array coupled to the request processing circuitry;

wherein the request processing circuitry comprises:
- a first plurality of storage devices coupled to the plurality of synchronous ports and adapted to store synchronous memory requests present on the synchronous ports;
- a second plurality of storage devices coupled to the plurality of asynchronous ports and adapted to store asynchronous memory requests present on the asynchronous ports; and
- priority circuitry coupled to the first and the second plurality of storage devices and to the memory array, the priority circuitry adapted to prioritize execution by the memory array of synchronous memory requests stored within the first plurality of storage devices and of asynchronous memory requests stored within the second plurality of storage devices.

25. The memory circuit of claim 24 further comprising a plurality of multi-request memory arrays.

* * * * *